United States Patent [19]
Erckert

[11] Patent Number: 5,689,199
[45] Date of Patent: Nov. 18, 1997

[54] COMPARATOR WITH HYSTERESIS IN BIPOLAR TECHNOLOGY

[75] Inventor: Ricardo Erckert, Bad Aibling, Germany

[73] Assignee: SGS-Thomson Microelectronics GmbH, Grasbrunn, Germany

[21] Appl. No.: 518,765

[22] Filed: Aug. 24, 1995

[30] Foreign Application Priority Data

Aug. 24, 1994 [DE] Germany ................ 44 30 032.8

[51] Int. Cl.$^6$ ............... H03K 5/153; H03K 3/037
[52] U.S. Cl. ................... 327/76; 327/77; 327/205
[58] Field of Search ................... 327/63–67, 68, 327/72, 73, 74, 76, 77–81, 87, 88, 89, 205, 206, 560–563

[56] References Cited

U.S. PATENT DOCUMENTS

| | | | |
|---|---|---|---|
| 3,628,059 | 12/1971 | Niu | 327/73 |
| 4,438,349 | 3/1984 | Shoji | 327/85 |
| 4,554,468 | 11/1985 | Rumbaugh et al. | 327/66 |
| 4,634,897 | 1/1987 | Yoshioka | 327/73 |
| 4,977,336 | 12/1990 | Martiny | 327/205 |
| 5,140,187 | 8/1992 | Schwob | 327/73 |
| 5,313,114 | 5/1994 | Poletto et al. | 327/65 |
| 5,367,211 | 11/1994 | Giordano et al. | 327/73 |

FOREIGN PATENT DOCUMENTS

| | | | |
|---|---|---|---|
| 3837832 | 5/1990 | Germany | H03K 17/30 |
| 4215423 | 11/1993 | Germany | H03K 3/295 |

OTHER PUBLICATIONS

*Industrtial and Automotive Ic.*, Siemens Aktiengesellschaft, 1990, p. 699.
*Fairchild Linear Integrated Circuit*, Data Book, 1976, pp. 9–37.
Gray, *Analysis and Design of Analog Integrated Circuits*, Wiley & Sons, Inc., 1984, p. 283.
Millman, *Microelectronics Second Edition*, McGraw–Hill, 1988, pp. 125–128 and 435–441.

*Primary Examiner*—Toan Tran
*Attorney, Agent, or Firm*—David V. Carlson; Seed and Berry LLP

[57] ABSTRACT

A comparator with hysteresis in bipolar technology having a voltage/current converter with a voltage input forming the comparator input connection, and a current output, a bistable current source with a current feeding connection coupled with the current output of the voltage/current converter and a current output connection forming the comparator output, the bistable current source being currentless in a first stable state and consuming current only in the second stable state, the firing current which must be fed to the current feeding connection to switch the bistable current source from the currentless state to the power-consuming state being different from the quenching current which must be fed to the current feeding connection to switch the bistable current source from the power-consuming state to the currentless state, to obtain a hysteresis of the comparator, and all transistors being formed as bipolar transistors. The entire power consumption of such a comparator can be made extremely low in one of its two switching positions.

3 Claims, 4 Drawing Sheets

5,689,199

COMPARATOR WITH HYSTERESIS IN BIPOLAR TECHNOLOGY

TECHNICAL FIELD

This invention relates to a comparator with hysteresis in bipolar technology.

BACKGROUND OF THE INVENTION

A frequent application of comparators with hysteresis is for detecting small input voltages. Typical examples are logic inputs which activate entire electronic systems by a logic value LOW, protection circuits which switch off circuits driven or supplied with an input or supply voltage when the latter drops below a certain threshold value, and reset generators. For these purposes one requires comparators which consume as little current as possible at input signals above the switching threshold. The power consumption at input signals below the switching threshold, on the other hand, is frequently of secondary importance.

It may also be, however, that one requires comparators with hysteresis which consume as little current as possible below a switching threshold while their power consumption at input signals above the switching threshold is of secondary importance.

One thus requires comparators with hysteresis which consume as little current as possible when their input signal is on a first side of a switching threshold, while the power consumption when the input signal is on the other side of the switching threshold is of secondary importance. On which side of the switching threshold the power consumption should be as low as possible depends on the individual application.

For this purpose, it is suitable to use circuits in CMOS technology which consume current only during the switch-over processes. Circuits in CMOS technology are relatively imprecise, however, when they have simple and unelaborate circuitry. To make them precise, one often requires high circuit complexity.

A simple CMOS circuit in the form of a simple Schmitt trigger is known from FIG. 1 of DE-A-38 37 821. FIG. 4 of this reference shows a CMOS precision Schmitt trigger having considerable circuit complexity to obtain a Schmitt trigger with a precise switching threshold.

DE-A-42 15 423 discloses a Schmitt trigger in MOS technology wherein the two threshold values leading to hysteresis of the Schmitt trigger are produced by two different comparators, one of which is conductive above an upper threshold value and currentless below the upper threshold value, while the other comparator is currentless above the lower threshold value and conductive below the lower threshold value. For the total circuit to be currentless both above the upper threshold value and below the lower threshold value outside the switch-over processes, the change of switching state of the particular comparator switching from the currentless to the conductive state is stored by means of a flip-flop, on the one hand, and the comparator that has passed into the conductive state is furthermore switched to a currentless state directly after its change of switching state.

With less effort, bipolar circuits can be produced more precisely than circuits in MOS technology. Conventional comparators with hysteresis in bipolar technology consume an equal amount of current in both switching states, however, since the hysteresis is caused either by switching currents from a current bank (an example of this is the integrated circuit TLE 4211, shown on page 699 of the book "Industrial and Automotive ICs", Siemens, 1990) or by positive feedback (an example in the form of a comparator with hysteresis is shown on pages 9–37 of "Data Book 1976" by Fairchild).

In addition, a comparator in bipolar technology is known which switches at the band gap voltage and is also called a band gap Schmitt trigger. An example of this is shown in FIG. 4 of DE-A-42 15 423. A band gap comparator has a not-very-temperature-dependent switching threshold of about 1.2 V. However, it already begins to consume current at an input signal far below this switching threshold and also does so above the switching threshold. That is, it consumes current in most of its operating range.

A band gap comparator or Schmitt trigger which is connected in usual fashion between a supply voltage source with a pole on positive potential and a ground pole is constructed with p-n-p transistors. This ensures that it is power-thrifty at low input signals below its switching threshold and is power-consuming at input voltages above its switching threshold, with the above-mentioned fuzziness that it already increasingly consumes current long before reaching the switching threshold. If one requires a comparator or Schmitt trigger with reverse behavior, which is power-consuming at low input voltages and power-thrifty at high input voltages, this cannot be obtained by a structure with transistors having opposite conductivity behavior. In this case, the input voltage would no longer be referred to a reference potential in the form of the ground potential, but to the positive supply voltage potential of the voltage source. The latter is generally not constant enough to permit sufficiently reliable operation of the band gap comparator.

One could also consider using comparators with hysteresis in a hybrid approach, i.e., in the form of integrated circuits using both MOS and bipolar technology. However, hybrid approach circuits are expensive because the production of such an integrated circuit necessitates many masks and a corresponding number of production steps.

If a comparator circuit with hysteresis is required which is simple and unelaborate, and thus cheap, but nevertheless precise, one should therefore provide a circuit which is executed in bipolar technology but still consumes as little current as possible at rest, i.e., at input signals which are on a certain side of the switching threshold. On which side of the switching threshold this holds depends on the requirement of the individual application and should be realizable as required.

SUMMARY OF THE INVENTION

A solution to the problem discussed above is embodied in a comparator with hysteresis in bipolar technology which is characterized by a) a voltage/current converter with a voltage input forming the comparator input connection, and a current output; and b) a bistable current source with a current feeding connection coupled with the current output of the voltage/current converter and a current output connection forming the comparator output; whereby c) the bistable current source is currentless in a first stable state and consumes current only in the second stable state;

d) the firing current which is fed to the current feeding connection to switch the bistable current source from the currentless state to the power-consuming state is different from the quenching current which is fed to the current feeding connection to switch the bistable current source from the power-consuming state to the currentless state, for obtaining hysteresis; and e) all transistors are formed as bipolar transistors.

The voltage/current converter can have a difference amplifier whose first input is fed a voltage signal to be monitored, whose second input is subjected to a reference potential, and whose output is coupled with the current feeding connection of the bistable current source.

Such a difference amplifier is known in the art, for example from page 435 of the book "Microelectronics" by Jacob Millman, 2nd edition, published by McGraw-Hill, 1988.

For the inventive comparator, it is preferable to use a difference amplifier having not only two amplifying transistors but also a current mirror circuit. The current mirror transistor connected with the current feeding connection of the bistable current source preferably has an emitter area which is n times as great as the emitter area of the current mirror transistor wired as a diode.

In a preferred embodiment of the inventive comparator, the bistable current source has two current mirror circuits forming a ring circuit fed back in itself, and a resistor being connected between the current mirror transistor of one current mirror circuit and the adjacent pole of a voltage supply source. The current mirror transistor connected with the resistor can have an emitter area that is m times as great as the emitter area of the diode-wired transistor of the same current mirror circuit.

A bistable current source of this type is known in the art, namely from the book "Analysis and Design of Analogue Integrated Circuits" by Paul R. Gray and Robert G. Meyer, 1984, published by John Wiley & Sons, page 283. Such current sources have generally been used up to now as reference current sources in integrated circuits, being operated at the one of their two possible operating points at which they provide current and thus also draw current from the power supply source. At the other operating point the current source is currentless. This operating point tends to be unstable, as stated in the book by Gray and Meyer.

The invention is based on the finding that the basically unstable operating point can be made stable by removing current from the current source, on the one hand, and that the current for firing the current source at its current-sinking stable operating point has a different current value from the current for quenching the current source, i.e., for converting it from the current-sinking state to the currentless state, on the other hand.

This finding is exploited by the invention in that the output connection of a voltage/current converter, preferably in the form of a difference amplifier, is connected with a current feeding connection of the current source. And since the output current of the voltage/current converter depends on the input voltage thereof, the value of this input voltage determines whether the current source is at the fired, power-consuming operating point or at the quenched, currentless operating point. However, since firing and quenching of the current source occur at different output currents of the voltage/current converter, the total circuit comprising voltage/current converter and current source has hysteresis. This total circuit can therefore be used as a comparator with hysteresis which provides an output current or not depending on whether the input voltage is below a lower threshold value or above an upper threshold value. Beyond one threshold value the total circuit consumes practically no current, while beyond the other threshold value it consumes current.

Beyond which of the two threshold values the total circuit is practically currentless or consumes current can be selected through the specific circuitry. If the voltage/current converter is formed as a difference amplifier in the preferred way, the threshold value beyond which practically no current is consumed can be determined by choosing that input of the difference amplifier which is fed a reference potential. Another possibility for determining beyond which threshold value the total circuit should be practically currentless is to select the conductivity types of the transistors used.

There are two possibilities for increasing the size of the hysteresis in the inventive circuitry which uses a difference amplifier as a voltage/current converter. One possibility is to connect an impedor, preferably in the form of at least one diode, between the switching point at which both amplifying transistors are connected with a bias current source, and the two amplifying transistors in each case. A further possibility is to feed back a voltage signal proportional to the output current of the current source to a voltage input of the voltage/current converter, preferably to the input of the difference amplifier subjected to the reference potential if a difference amplifier is used as a voltage/current converter. These two measures for increasing the hysteresis can also be combined.

The invention provides an integrated comparator which has a relatively simple and thus cost-effective structure, is practically currentless below a threshold value and conducts current above a threshold value or, conversely, conducts current below a threshold value and is practically currentless above a threshold value, depending on the circuit layout, and works very exactly due to the application of bipolar technology.

BRIEF DESCRIPTION OF THE DRAWINGS

The invention will now be explained more closely with reference to embodiments. In the drawings.

DETAILED DESCRIPTION OF THE INVENTION

Figure 1:
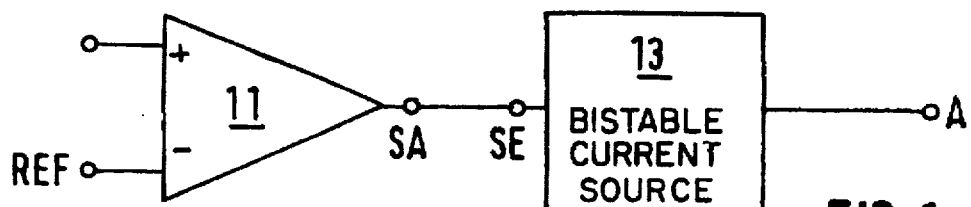
FIG. 1 shows a basic wiring diagram of a preferred embodiment of an inventive comparator with hysteresis.

FIG. 1 shows a block diagram of a preferred embodiment of an inventive comparator with hysteresis having a voltage/current converter in the form of difference amplifier 11 and bistable current source 13. Input voltage VIN to be compared with the threshold of the comparator is fed to noninverting input EIN. Inverting input (−) is connected with reference potential REF. Current output SA of difference amplifier 11 is connected with current feeding connection SE of current source 13. A current output connection of current source 13 forms output A of the comparator.

Figure 2:
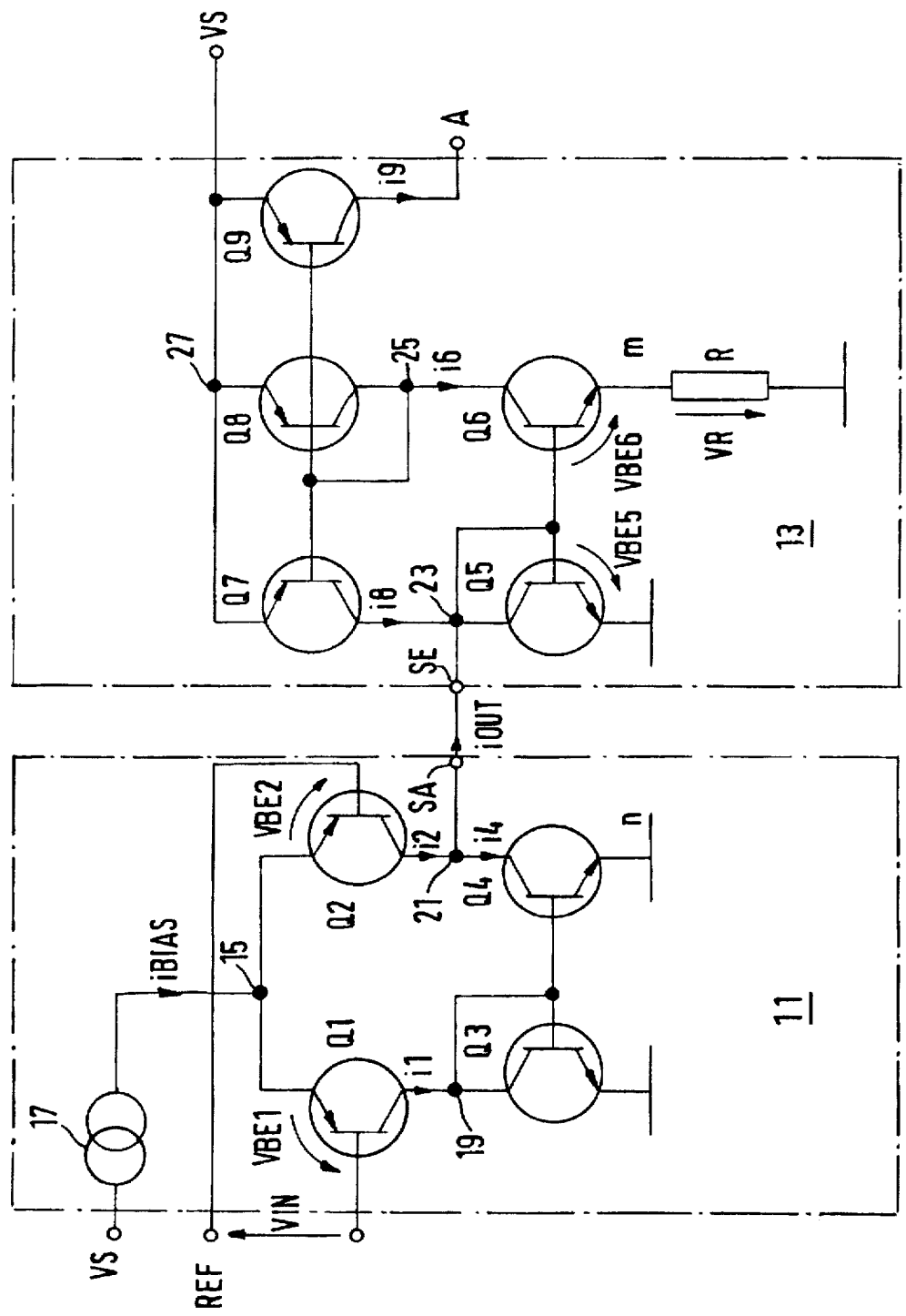
FIG. 2 shows a circuit diagram of a practical realization of the embodiment shown in FIG. 1.

FIG. 2 shows a wiring diagram of a circuit layout for realizing the comparator shown in FIG. 1. The two circuit parts which constitute difference amplifier 11 and current source 13 are indicated by dot-dash blocks.

Difference amplifier 11 has an amplifier part with first transistor Q1 and second transistor Q2 as well as a current mirror part with diode-wired third transistor Q3 and fourth transistor Q4. Q1 and Q3, on the one hand, and Q2 and Q4, on the other hand, are series-connected in each case. Transistors Q1 and Q3 are interconnected at switching point 19 and transistors Q2 and Q4 at switching point 21. Between the base terminals of the two transistors Q1 and Q2 is input voltage VIN, which is to be compared with the threshold of the comparator.

Bistable current source 13 has a lower current mirror with diode-wired transistor Q5 and transistor Q6 as well as an upper current mirror with transistor Q7, diode-wired transistor Q8 and transistor Q9. Transistors Q5 and Q7 are series-connected and interconnected at switching point 23. Transistors Q8 and Q6 form a further series connection and are interconnected at switching point 25. The emitters of transistors Q5 and Q6 are connected to ground, Q5 directly and Q6 via resistor R. The emitters of transistors Q7, Q8 and Q9 are interconnected at switching point 27, which is in turn connected with positive pole VS of the supply voltage source.

Difference amplifier 11 and current source 13 are interconnected by connection of the two intermediate nodes 21 and 23. The first intermediate node 21 forms current output SA of difference amplifier 11, and the second intermediate node 23 forms current feeding connection SE of bistable current source 13. The collector of transistor Q9 is connected with output connection A of the comparator.

In the embodiment example shown in FIG. 2, transistors Q1, Q2, Q7, Q8 and Q9 connected with supply potential VS are formed by bipolar p-n-p transistors, while transistors Q3 to Q6 connected with the ground connection are formed by bipolar n-p-n transistors.

Transistor Q4 has an emitter area which is n times as great as the emitter area of diode-wired transistor Q3. Transistor Q6 of the lower current mirror of current source 13 has an emitter area that is m times as great as the emitter area of diode-wired transistor Q5 of this current mirror.

The mode of functioning of the embodiment shown in FIG. 2 will now be explained. The mode of functioning of difference amplifier 11 will be considered first. After that the mode of functioning of current source 13 will be considered. Finally the total function of the circuit shown in FIG. 2 will be considered.

Mode of Functioning of Difference Amplifier 11

Current source 17 provides current iBIAS. The collector currents of transistors Q1 and Q2 are i1 and i2. The collector current of transistor Q4 is i4. The current flowing from switching point 21 to current source 13 is designated iOUT.

According to Ebers and Moll the following holds for collector currents i1 and i2:

$$i1 = is \cdot \exp\frac{VBE1}{VT} \quad (1)$$

$$i2 = is \cdot \exp\frac{VBE2}{VT} \quad (2)$$

This holds for the approximation i1, i2>> is with the well-known formula $$VT = \frac{K \cdot T}{e} \quad (3)$$

for temperature voltage VT.

By transforming the equation $$\frac{i1}{i2} = \frac{is \cdot \exp(VBE1/VT)}{is \cdot \exp(VBE2/VT)} \quad (4)$$

one obtains $$\frac{i1}{i2} = \exp\frac{VBE1 - VBE2}{VT} \quad (5)$$

Designating the base-emitter voltages of transistors Q1 and Q2 as VBE1 and VBE2, one obtains according to Kirchhoff's law $$VBE1 + VIN - VBE2 = 0 \quad (6)$$

By transformation one obtains $$VBE1 - VBE2 = -VIN \quad (7)$$

Putting equation (7) in equation (5), one obtains for the ratio of collector currents i1 and i2

$$\frac{i1}{i2} = \exp(-VIN/VT) \quad (8)$$

Neglecting the base currents of Q1 and Q2 the following holds:

$$i1 + i2 = iBIAS \quad (9)$$

It follows that $$i1 = iBIAS - i2 \quad (10)$$

and $$i2 = iBIAS - i1 \quad (11)$$

Putting the expression resulting for i2 from equation (8) in equation (10), and multiplying the resulting equation by exp (−VIN/VT), one obtains after transformation and solution according to i1

$$i1 = iBIAS - \frac{i1}{\exp(-VIN/VT)} \quad (12)$$

With the aid of equation (8) and solution according to i1 and i2 one obtains $$i1 = iBIAS \cdot \frac{1}{1 + \exp(VIN/VT)} \quad (13)$$

and $$i2 = iBIAS \cdot \frac{1}{1 + \exp(-VIN/VT)} \quad (14)$$

Transistors Q3 and Q4 work as current mirrors with the transformation ratio n. This results in $$i4 = n \cdot i1 \quad (15)$$

Current iOUT delivered by difference amplifier 11 to current source 13 is calculated as $$iOUT = i2 - i4 \quad (16)$$

Putting equation (15) in equation (16) one obtains $$iOUT = i2 - n \cdot i1 \quad (17)$$

Putting equations (13) and (14) in equation (17) one obtains after transformations $$iOUT = iBIAS \cdot \frac{1 - n \cdot \exp(-VIN/VT)}{1 + \exp(-VIN/VT)} \quad (18)$$

Equation (18) shows that current iOUT delivered by difference amplifier 11 to current source 13 is dependent on current iBIAS of current source 17 of difference amplifier 11, on ratio n of the emitter areas of transistors Q4 and Q3, and on input voltage VIN of difference amplifier 11. Since current iBIAS delivered by current source 17 and emitter area ratio n are constant, output current iOUT of difference amplifier 11 depends directly on input voltage VIN.

For normal difference amplifiers n=1 is chosen. The choice n>1 is suitable if iOUT is to be able to assume greatly negative values.

Mode of Functioning of Bistable Current Source

We will now consider bistable current source 13. The collector currents of transistors Q5, Q6, Q8 and Q9 are designated i5, i6, i8 and i9. Voltage VR drops across resistor R. As mentioned above, transistor Q6 has m times the emitter area of transistor Q5.

In the following calculations the base currents of the transistors are again neglected.

At the collector of transistor Q5 the following current balance holds:

$$i5 = iOUT + i8 \quad (19)$$

The function of current mirror Q7 and Q8 leads to $$i8 = i6 \quad (20)$$

For the voltage drop across resistor R it holds that $$VR = i6 \cdot R \quad (21)$$

According to Ebers and Moll the following holds for currents i5 and i6:

$$i5 = is \cdot \exp(VBE5/VT) \quad (22)$$

and $$i6 = is \cdot m \cdot \exp(VBE6/VT) \quad (23)$$

This holds for i5, i6 >> is. This assumption is admissible since usual values for is are $10^{-15}$ A. Forming the ratio of currents i6 to i5 with the aid of equations (22) and (23), one obtains $$\frac{i6}{i5} = \frac{m \cdot is \cdot \exp(VBE6/VT)}{is \cdot \exp(VBE5/VT)} \quad (24)$$

This leads after transformations to $$\frac{i6}{i5} = m \cdot \exp\left(\frac{VBE6 - VBE5}{VT}\right) \quad (25)$$

With base-emitter voltages VEB5 and VEB6 of transistors Q5 and Q6 it follows from Kirchhoff's law that $$VEB6 + VR - VEB5 = 0 \quad (26)$$

from which it follows that $$VEB6 - VEB5 = -VR \quad (27)$$

Putting equation (27) in equation (25) one obtains $$\frac{i6}{i5} = m \cdot \exp(-VR/VT) \quad (28)$$

Replacing i5 in equation (28) by equation (19), one obtains $$\frac{i6}{iOUT + i8} = m \cdot \exp(-VR/VT) \quad (29)$$

Replacing i8 by i6 according to equation (20), one obtains $$\frac{i6}{iOUT + i6} = m \cdot \exp(-VR/VT) \quad (30)$$

By bilateral logarithmation and subsequent transformation and bilateral multiplication by VT one arrives at $$i6 = \frac{VT}{R6} \left[ \ln(m) + \ln\left(\frac{iOUT + i6}{i6}\right) \right] \quad (31)$$

For most cases equation (31) is to be solved only by an iterative method. Such methods are known in the art from nonlinear network analysis. For the special case iOUT=0 an analytical solution is possible because for this case the second term in equation (31) becomes ln (1)=0. In this case, for which the collector current of Q6 is designated $i6_0$, it follows that $$i6_0 = \ln(m) \cdot \frac{VT}{R} \quad (32)$$

This is the current which is stated for transistor Q6 with an emitter area twice as great as that of transistor Q5 in equation 4.193 on page 331 of the above-mentioned book "Analysis and Design of Analogue Integrated Circuits".

In the following the firing condition and quenching condition of bistable current source 13 will be sought.

Before the firing of current source 13, i.e., as long as the latter is held stable at its currentless operating point, no current flows through current source 13 so that i6=0. The term in square brackets in equation (31) must therefore yield 0. For this currentless state it follows that $$\frac{iOUT + i6}{i6} = \frac{1}{m} \quad (33)$$

Solved according to iOUT, one obtains $$iOUT = i6 \left(\frac{1 - m}{m}\right) \quad (34)$$

Before firing of current source 13, i6=0. This results in the condition for firing the current source:

$$iOUT > 0 \quad (35)$$

If one wants to quench fired current source 13 one must make current i6 0. Therefore equation (34) also holds as the quenching condition. Before current source 13 is quenched, however, i6>0 and therefore the following holds in the case of quenching:

$$iOUT < i6 \left(\frac{1 - m}{m}\right) \quad \text{with } i6 > 0 \quad (36)$$

Current i6 in relation (36) is again calculated from equation (31). Relations (31) and (36) must again be solved iteratively.

For an example of such an iterative solution one begins with an analytical solution with the values
iOUT=0
m=3

R=14KΩ

For iOUT=0 equation (32) again holds. Putting the above-mentioned values for m and R in equation (32) as well as VT=26 mV in known fashion, one arrives at $$i6 = \frac{VT}{R} \ln(m) = 2.04 \, \mu A \qquad (37)$$

For iteration with the above-mentioned values a value of iOUT=−0.5 μA is assumed. With the starting value of 2.04 μA calculated above for $i6_0$ an iteration method with the aid of equation (31), whose individual steps are not rendered here, leads to a value i6<0 in the sixth iteration step. Since current i6 of current source 13 cannot be smaller than 0 in the fired state thereof, this means that a current break has occurred. That is, with the value iOUT=−0.5 μA assumed for the iteration a current break and thus quenching of current source 13 takes place in a circuit with the above-mentioned specific values.

A worst-case calculation on the basis of equation (36) and neglecting resistor R yields that the current break definitely occurs at the latest at $$iOUT<2.04 \, \mu A \cdot (-\tfrac{2}{3}) = -1.36 \, \mu A \qquad (38)$$

Figure 3:
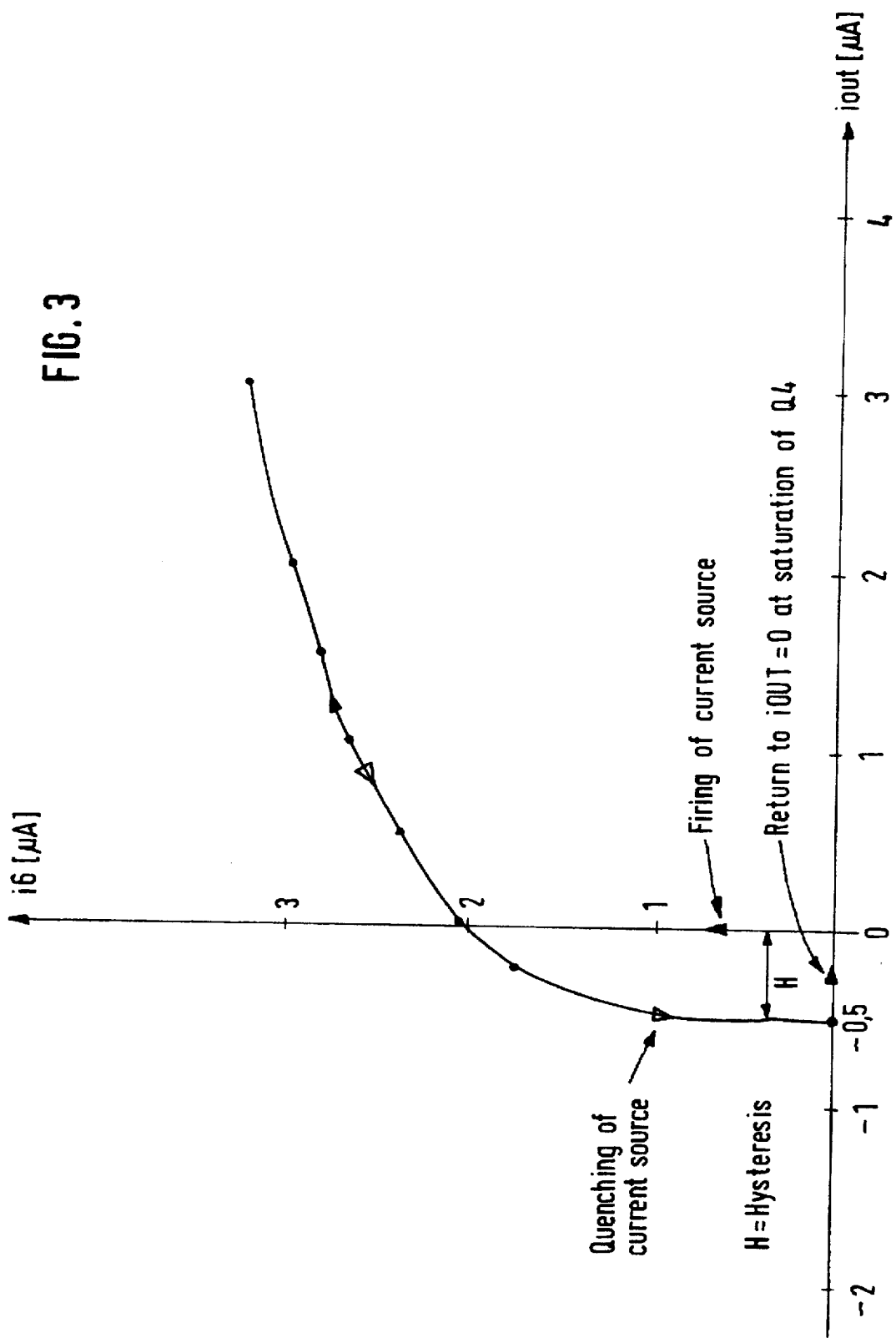
FIG. 3 shows a current characteristic indicating a firing current and a quenching current of the current generator of an inventive circuit.

FIG. 3 shows the dependence of collector current i6 of transistor Q6 of current source 13 on output current iOUT of difference amplifier 11, obtained by an iterative calculation.

Increasing current iOUT coming from current value −2 μA, current i6 remains 0 as long as iOUT has negative values. According to the firing condition in relation (35), current source 13 fires as soon as the value of current iOUT becomes>0. Due to the feedback of the two current mirrors Q5, Q6 and Q7, Q8 of current source 13 a sudden rise of current i6 follows, according to the bistable behavior of current source 13, to a value other than 0. With the above-mentioned exemplary values for m and R, current $i6_0$=2.04 μA results at the moment of firing, as is entered in FIG. 3. As the value of current iOUT increases after firing, i6 increases in the way shown in FIG. 3.

To quench current source 13, iOUT must be lowered to the current value necessary for quenching. According to the above-mentioned iterative calculation a current break takes place at a current of iOUT=−0.5 μA.

To quench current source 13, iOUT must thus be lowered to a value lower than the current value necessary for firing current source 13. This causes the hysteresis of the inventive comparator.

Functioning of Comparator

We will now consider the functioning of the total circuit and determine its hysteresis. With the values of iOUT previously determined—partly by iterative calculation—for firing and quenching current source 13, one can calculate with the help of equation (18) the particular input voltage VIN of difference amplifier 11 necessary for ruing and quenching current source 13.

In the case of firing, iOUT=0 (see equation 34). From equation (18) it therefore results that $$iBIAS \cdot \frac{1 - n \cdot \exp(-VIN/VT)}{1 + \exp(-VIN/VT)} = 0 \qquad (39)$$

Consideration of the numerator of (39) alone yields $$1 - n \cdot \exp(-VIN/VT) = 0 \qquad (40)$$

By transformation one obtains $$VIN = \ln(n) \cdot VT \qquad (41)$$

To fire current source 13 one must thus feed an input voltage with a value according to equation (41). In a practical embodiment of the circuit shown in FIG. 2, transistor Q4 has an emitter area which is n=4 times as great as that of transistor Q3. For this, equation (41) yields input voltage VIN=36 mV.

For the case of quenching the following accordingly holds:

$$iBIAS \cdot \frac{1 - n \cdot \exp(-VIN/VT)}{1 + \exp(-VIN/VT)} = iOUT_{Quench} \qquad (42)$$

Equation (42) again requires an iterative solution. Assuming for the quenching condition according to the above determination current iOUT=−0.5 μA, current iBIAS=1 μA and a ratio of the emitter areas of transistors Q4 and Q3 of n=4, the iterative solution leads to input voltage VIN=21 mV for quenching the current source.

Figure 4:
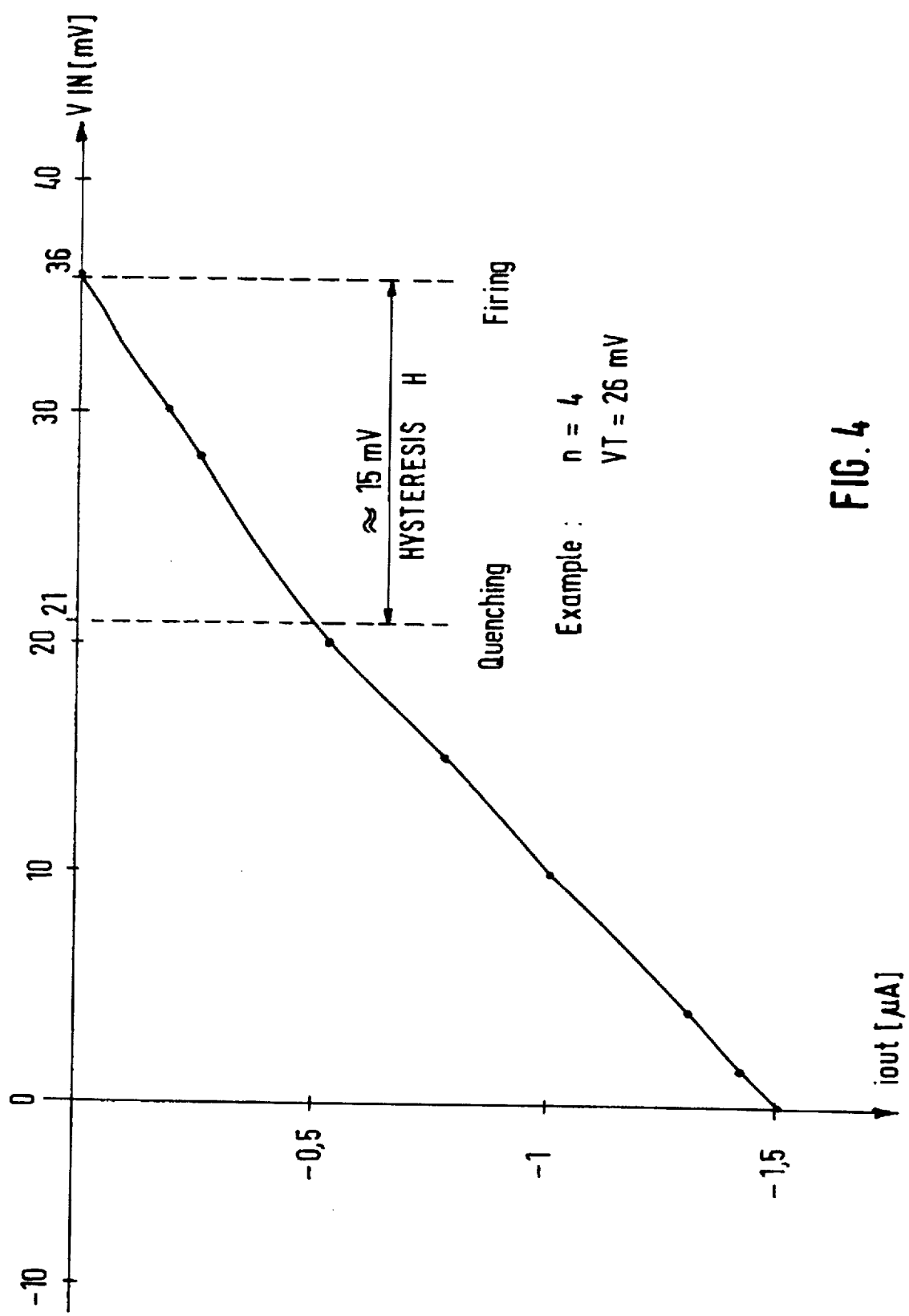
FIG. 4 shows a characteristic indicating the dependence of the firing and quenching of the current source by the input voltage of the difference amplifier of the circuit shown in FIG. 2.

This is illustrated in FIG. 4, in which output current iOUT of difference amplifier 11 is plotted as a function of input voltage VIN. This figure shows the voltage levels for VIN necessary for firing and quenching current source 13. In the assumed embodiment example with the specific values, a firing of current source 13 occurs when difference amplifier input voltage VIN exceeds a threshold of 36 mV. Fired current source 13 is quenched when difference amplifier input voltage VIN falls below a value of 21 mV. The difference between the firing voltage of 36 mV and the quenching voltage of 21 mV constitutes the hysteresis of the comparator circuit. In the example rendered in FIG. 4 the hysteresis is 15 mV.

If the comparator circuit shown in FIG. 2 is dimensioned as is assumed for FIGS. 3 and 4, the following holds.

As long as the input voltage of difference amplifier 11 is below the firing voltage of 36 mV, current source 13 remains currentless. When the firing voltage of 36 mV is exceeded current source 13 is fired, i.e., put in the conductive state. When input voltage VIN of difference amplifier 11 is subsequently lowered, current source 13 is quenched only if the quenching voltage threshold of 21 mV is fallen below. Only then does current source 13 pass into the currentless state again. The 15 mV between firing voltage and quenching voltage forms the hysteresis of the total circuit, i.e., of the inventive comparator.

In the embodiment shown in FIG. 2 the comparator is current-carrying at an input voltage above the firing voltage, and practically currentless at an input voltage below the quenching voltage. Then only small current iBIAS of current source 17 is flowing.

By conversely treating the two input connections of difference amplifier 11, namely applying input voltage VIN to the inverting input (FIG. 1) of difference amplifier 11 and the reference potential to the noninverting input, one can obtain a converse behavior of the comparator. Such a comparator would then conduct current when input voltage VIN is below a lower threshold, while being practically currentless when input voltage VIN is above an upper threshold.

The same result would be achieved by replacing all transistors Q1 to Q9 in the circuit shown in FIG. 2 by transistors of the opposed conductivity type.

In addition, it is noted that collector current i9 of transistor Q9 is equal to collector current i6 of transistor Q6 in the embodiment shown in FIG. 2, because transistors Q7 to Q9 form a current mirror which conducts the same current in all current mirror branches. Output current i9 at comparator output A therefore behaves exactly like collector current i6 of transistor Q6. That is to say, the considerations regarding current i6 in FIGS. 3 and 4 are applicable to output current i9 of the comparator.

Figure 5:
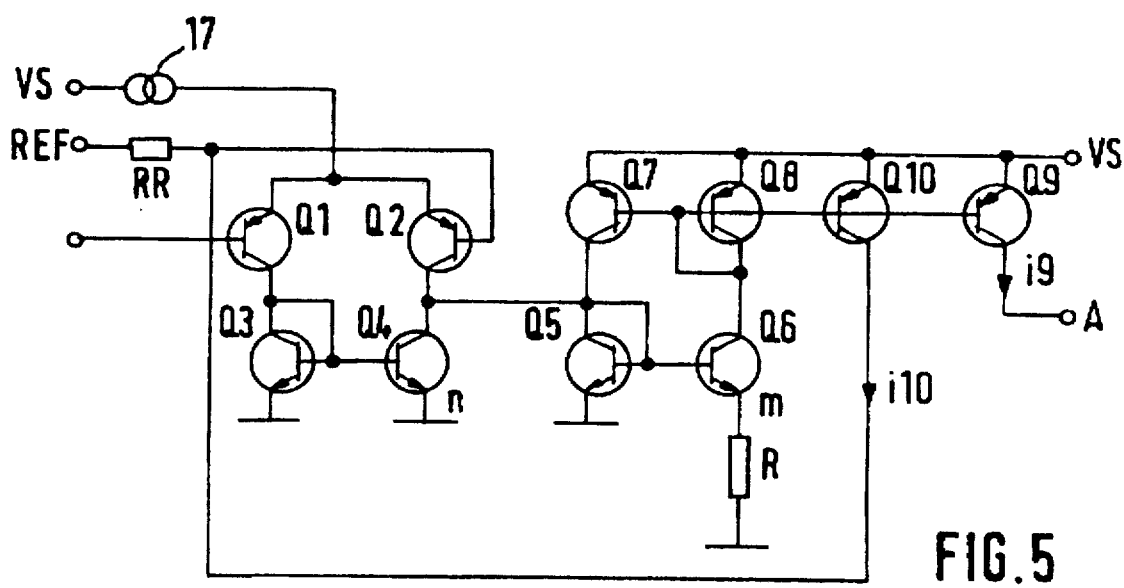
FIG. 5 shows a first modification of the embodiment shown in FIG. 2 with feedback for increasing the hysteresis.

FIG. 5 shows a comparator circuit matching the comparator circuit shown in FIG. 2, except that the input of the difference amplifier which is fed the reference potential is fed back to the upper current mirror of bistable current source 13. For this purpose the upper current mirror has further transistor Q10 whose collector current i10 corresponds to collector current i6 of transistor Q6 and output current i9 of current mirror Q7 to Q10. Between the reference potential input of the difference amplifier and the reference potential source, resistor RR is connected for converting feedback current i10 coming from current source 13 to a corresponding voltage which is superimposed on the reference potential of the reference potential source.

When bistable current source 13 is in the fired and thus conductive state, the voltage drop caused across resistor RR by i10 is added to the reference potential. This causes the switch-off, i.e., quenching, of current source 13 to happen later if the input voltage is lowered. Depending on the dimensioning of resistor RR, a much greater hysteresis can therefore be reached than in the embodiment without such feedback shown in FIG. 2.

Figure 6:
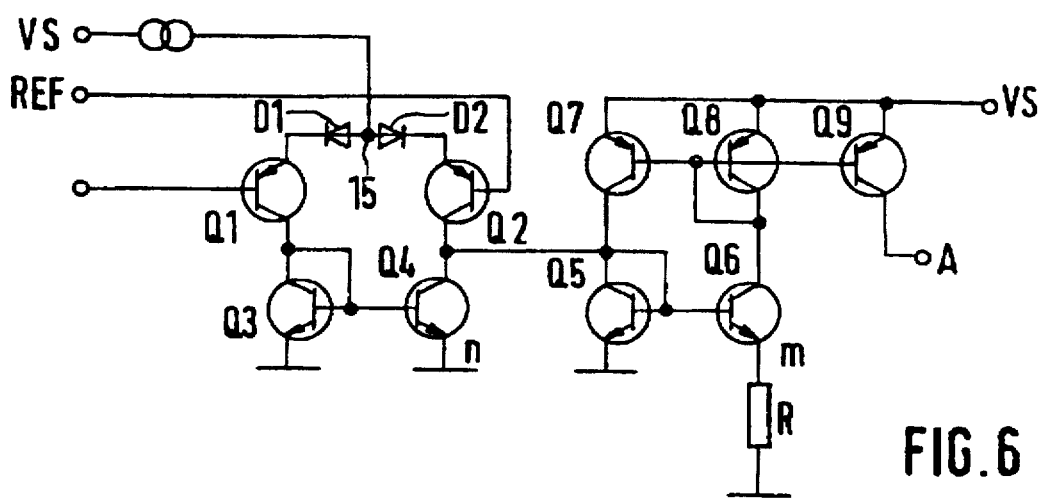
FIG. 6 shows a second modification of the embodiment shown in FIG. 3 with increased hysteresis.

A further possibility of increasing the hysteresis is apparent from the embodiment shown in FIG. 6. Diode D1 or D2 is connected between switching point 15 and the emitter of each of transistors Q1 and Q2. This means that input voltage VIN must exceed a greater threshold value in each switching direction to fire or quench current source 13. This increases the hysteresis.

If the hysteresis is to be increased even further, one can add two or more diodes to the emitter of each of transistors Q1 and Q2.

Instead of diodes one can also use resistors for increasing the hysteresis. The voltage drop which current BIAS produces across each of these two resistors leads to a corresponding increase in the hysteresis.

The measures for increasing hysteresis shown in FIGS. 5 and 6 can also be combined. That is, one can use in a further embodiment both the feedback as in FIG. 5 and the impedors, e.g., diodes, added to the emitters of transistors Q1 and Q2 to obtain an accumulative increase in the hysteresis.

A special advantage of the inventive comparator is that its total power consumption in one of the two switching positions is only current iBIAS provided by current source 17 of difference amplifier 11. This current can be made extremely small.

It will be appreciated that, although specific embodiments of the invention have been described herein for purposes of illustration, various modifications may be made without departing from the spirit and scope of the invention. Accordingly, the invention is not limited except as by the appended claims.

I claim:

1. A comparator with hysteresis in bipolar technology, comprising:

a voltage/current converter with a voltage input forming the comparator input connection, a reference input and a current output;

a bistable current source with a current feeding connection coupled with the current output of the voltage/current converter and a current output connection forming the comparator output; whereby the bistable current source is currentless in a first stable state and consumes current only in the second stable state;

a firing current of the current output which must be fed to the current feeding connection to switch the bistable current source from the currentless state to the power-consuming state is different from a quenching current of the current output which must be fed to the current feeding connection to switch the bistable current source from the power-consuming state to the currentless state, to obtain a hysteresis of the comparator; wherein the bistable current source has first and second current source current mirror circuits which jointly form three circuit branches of which a first and second are connected between positive and negative poles of the supply voltage source;

the first of these circuit branches has a series connection with a first current mirror diode of the first current source current mirror circuit and a first current mirror transistor of the second current source current mirror circuit;

the second of these circuit branches has a series connection with a first current mirror transistor of the first current source current mirror circuit and a current mirror diode of the second current source current mirror circuit;

the third circuit branch has a second current mirror transistor of the second current source current mirror circuit, whose main path is connected between the positive of the supply voltage source and the comparator output;

a resistor is connected between the main path of the current mirror transistor of the first current source current mirror circuit and the negative pole of the supply voltage source located on the side of this current mirror transistor; and a connection point between the current mirror diode of the first current source current mirror circuit and the first current mirror transistor of the second current source current mirror circuit forms the current feeding connection of the bistable current source.

2. The comparator of claim 1, wherein the current mirror diode of the first current source current mirror circuit is formed by a diode-wired transistor, and the first current mirror transistor of the first current source current mirror circuit has an emitter area that is greater than the emitter area of the diode-wired transistor of the first current source current mirror circuit.

3. The comparator of claim 1, wherein a feedback path is provided for increasing the hysteresis, which feeds a feedback voltage proportional to the output current of the bistable current source to the reference input of the voltage/current converter.

* * * * *